United States Patent [19]
Nordin

[11] Patent Number: 5,353,192
[45] Date of Patent: Oct. 4, 1994

[54] CIRCUIT CARD ASSEMBLY

[75] Inventor: Ronald A. Nordin, Naperville, Ill.

[73] Assignee: AT&T Bell Laboratories, Murray Hill, N.J.

[21] Appl. No.: 14,936

[22] Filed: Feb. 8, 1993

[51] Int. Cl.$^5$ .............................................. H05K 7/20
[52] U.S. Cl. .................... 361/700; 165/80.4;
165/80.5; 165/185; 165/104.33; 174/16.3;
174/15.2; 361/690; 361/702; 361/707; 361/710;
361/720
[58] Field of Search ................. 165/80.4, 185, 104.33,
165/80.5; 174/16.3, 15.1, 15.2; 361/382, 383,
385–389, 690, 689, 702, 700, 704, 707–711, 713,
719, 720

[56] References Cited

U.S. PATENT DOCUMENTS

| 4,802,532 | 2/1899 | Dawer et al. | 361/383 |
| 5,095,404 | 3/1992 | Chao | 361/385 |

FOREIGN PATENT DOCUMENTS

| 0281404 | 9/1988 | European Pat. Off. | 361/386 |
| 0020699 | 1/1989 | Japan | 361/386 |

*Primary Examiner*—Gregory D. Thompson
*Attorney, Agent, or Firm*—Dwight A. Marshall; Charles L. Warren

[57] ABSTRACT

A plug-in circuit card assembly for mounting high power electrical and optical components. The apparatus comprises a printed wiring circuit mounting high power electrical and optical components and connectors with conducting paths interconnecting the components and ones of the components with the connectors. The assembly has a structure attached to the printed wiring circuit with a heat sink formed at one end and having a pair of plates extending outward therefrom. One plate mounts a plurality of high thermal conducting pedestals each engaging corresponding ones of the components. Vent tubes are positioned between the plates with each vent tube having one end engaging one of the pedestals and an opposite end engaging the heat sink and functions to conduct heat from the components to the heat sink for dissipation.

9 Claims, 2 Drawing Sheets

CIRCUIT CARD ASSEMBLY

TECHNICAL FIELD

The invention relates to a circuit card assembly and in particular to a circuit card assembly for mounting high power electrical and optical components.

BACKGROUND AND PROBLEM

Electrical and electronic equipment is oftentimes constructed of circuit card assemblies mounting components and which are installed in and interconnected by plug-in circuit card assembly mounting apparatus to form the equipment. Typically, the plug-in circuit card assembly mounting apparatus is constructed with rows of shelves wherein each shelf is open at the front and arranged to receive a number of plug-in circuit card assemblies. The back of each shelf may have a printed wiring backplane structure arranged to receive each plug-in circuit card assembly and interconnect the installed circuit card assemblies to form the electrical and electronic equipment.

Components mounted on a circuit card assembly generate heat which must be dissipated to insure proper operation of the circuit card assembly and other circuit card assemblies installed in the mounting apparatus. In low power equipment applications, the shelves may be sufficiently spaced apart to allow the component generated heat to dissipate in the space among the shelves. Higher power equipment requires that cooling fans be installed in the circuit card assembly mounting apparatus to dissipate the component generated heat. In yet higher power equipment, cooling water is required to circulate throughout the mounting apparatus to cool installed circuit card assemblies.

The technological advance of equipment design results in components that have a multitude of electrical circuits that are reduced in size to fit into a component and which electrical circuits operate at a sufficient high power to generate a large amount of heat.

A problem arises in that new types of components, in addition to generating more heat, are smaller in size thereby allowing more components to be mounted on a circuit card assembly and thereby cause more heat to be generated by the circuit card assembly. Accordingly, a need exists for a circuit card assembly having a structure arranged to transfer heat generated by components mounted on the circuit card assembly to a common heat sink arranged to dissipate the component generated heat.

SOLUTION

The foregoing problem is solved by a circuit card assembly having a heat sink for dissipating component generated heat and which is constructed with a heat transfer assembly for transferring heat generated by circuit card assembly mounted components to the heat sink for dissipation. The circuit card assembly, in accordance with the principles of the invention, comprises a printed wiring circuit mounting components and connectors. The printed wiring circuit has apertures formed therein with each aperture having contacts formed around a perimeter of the aperture with each contact engaging a corresponding terminal of a component positioned over the aperture and with each contact coupled with an electrical conducting path. A structure is assembled to the printed wiring circuit and has heat sink devices with a pair of plates extending outward therefrom with one plate supporting the printed wiring circuit. The mounting plate is formed with heat absorption pedestals each corresponding with one of the printed wiring circuit board apertures and extending up through the aperture to engage a component positioned over the aperture. Vent tubes are positioned between the pair of plates with each vent tube having one end engaging a heat sink device to conduct heat from a component to the heat sink.

DETAILED DESCRIPTION

Figure 1:
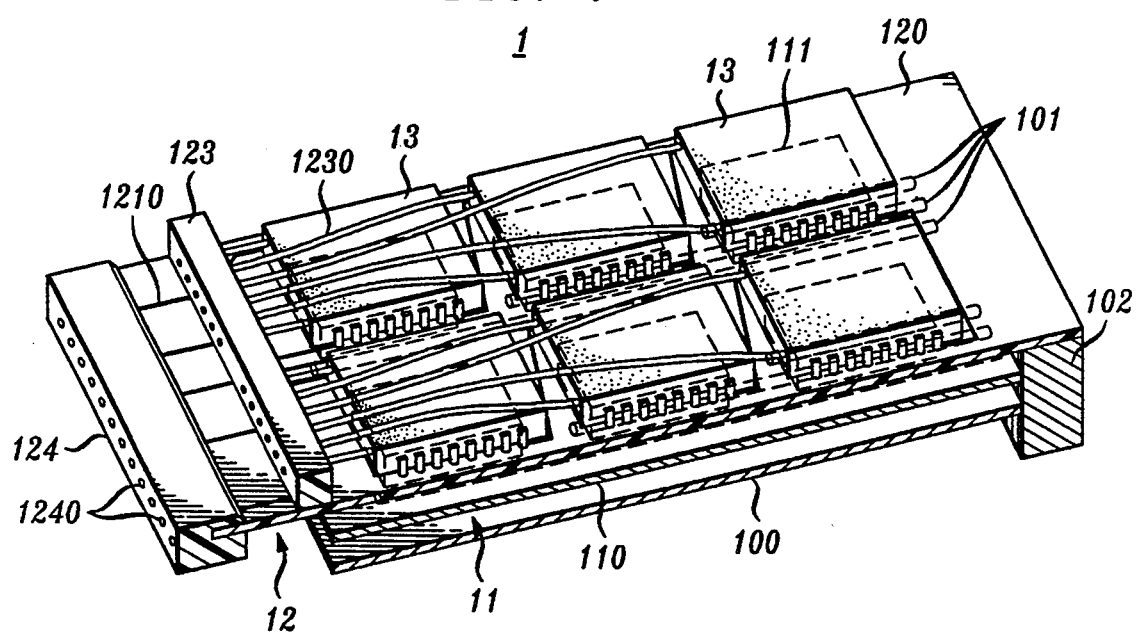
FIG. 1 illustrates a circuit card assembly in accordance with the principles of the invention, and FIG. 2 sets forth an exploded view of the circuit card assembly set forth in FIG. 1.

In an exemplary embodiment of the invention, as set forth in FIG. 1 of the drawing, circuit card assembly 1 has a printed wiring circuit 12 mounting a plurality of components 13 and connectors 123, 124 and having conducting paths 1210 interconnecting components 13 and components 13 with connectors 123, 124. Structure 11 is assembled to printed wiring circuit 12 and has heat sink 102 formed at one end terminating a heat transfer assembly engaging components 13 for transferring heat generated by engaged components 13 to heat sink 102 for dissipation.

Figure 2:
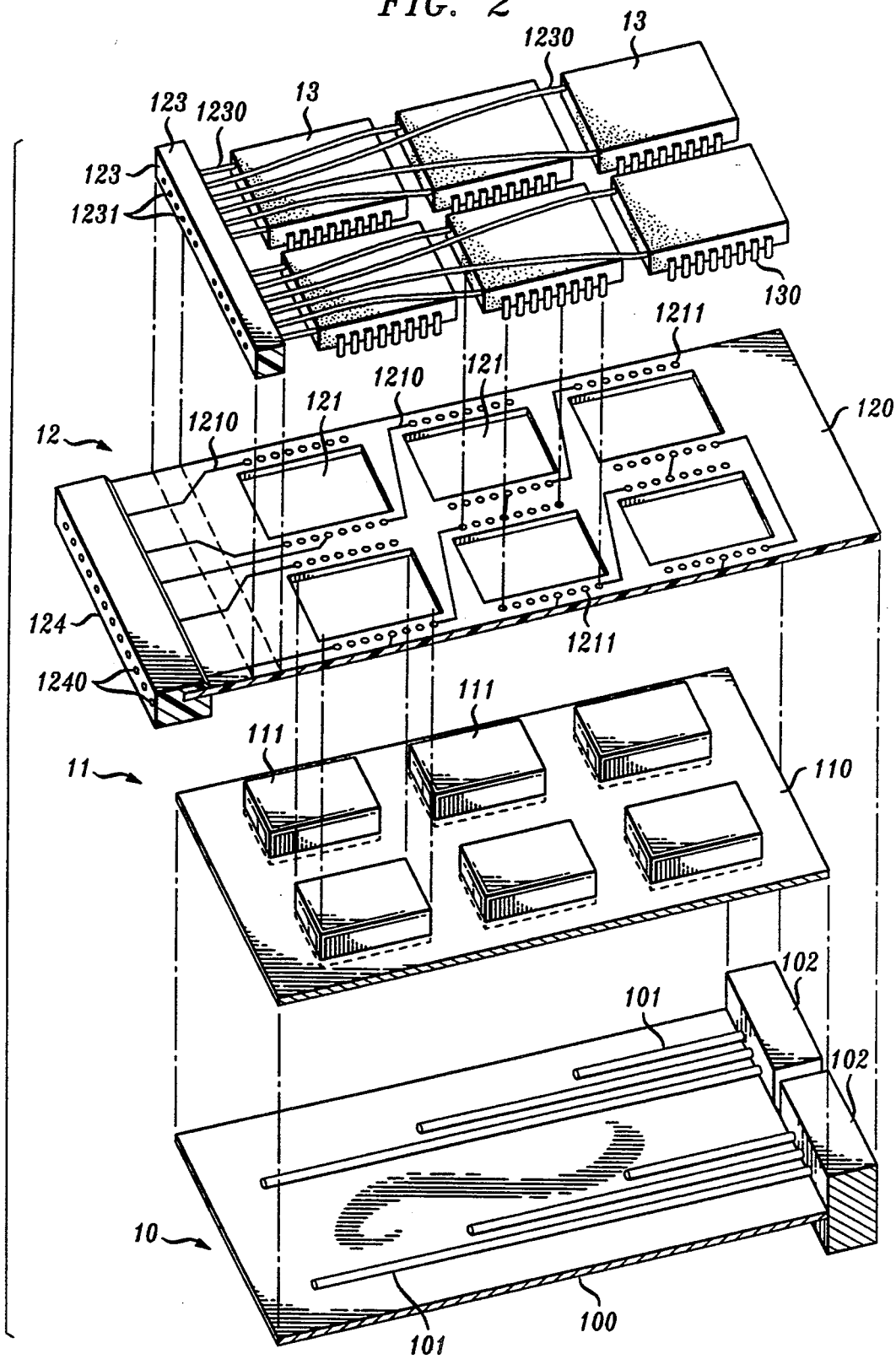

Printed wiring circuit 12, FIG. 2, may be formed of a flexible material, such as mylar, or may be a rigid single or multiple layer board such as board 120. Such printed wiring circuits are well-known and need not be described in detail for an understanding of the invention. Sufficient to say that printed wiring circuit 12 is of a generally rectangular configuration having a plurality of apertures 121 formed therein. Each aperture 121 has contacts 1211 foraged around a perimeter with each contact 1211 engaging a corresponding terminal of a component 13. Contacts 1211 may be deposited on the surface of printed wiring circuit 12 so as to engage terminals of surface mounted components or may be plated-through holes formed to receive component terminals 130 inserted into the holes. A component 13 is positioned over an aperture 121 with each component terminal 130 engaging a corresponding contact 1211. Contacts 1211 are coupled with electrical conducting paths 1210 interconnecting components 13 and components 13 with connectors 123, 124.

Printed wiring circuit 12 may, in some applications, mount an electrical connector 124 affixed to one end of printed wiring circuit 12. Electrical connector 124 may be any of a number of well-known types of male or female connectors and serves to interconnect the circuitry mounted on printed wiring circuit 12 with plug-in circuit card assembly apparatus, not shown, to form electrical and electronic equipment. Electrical connector 124, in the well manner, has male or female connector contacts 1240 each terminating ones of electrical conducting paths 1210 and functions to interconnect terminated electrical conducting paths 1210 with other circuit card assemblies when circuit card assembly 1, FIG. 1, is installed in plug-in circuit card assembly mounting apparatus.

In yet other applications, printed wiring circuit 12 may have an optical connector 123 affixed to one end of printed wiring circuit 12 adjacent electrical connector 124. Optical connector 123 is arranged to terminate optical transmitting and receiving conductors 1230 of optical elements which are mounted on printed wiring circuit 12 and herein identified as ones of components 13. Optical connector 123, in the well-known manner, engages a similar type of optical connector of plug-in circuit card assembly mounting apparatus to interconnect optical conductors 1230 with optical conductors of plug-in circuit card assembly mounting apparatus. It is to be understood that circuit card assembly 1 may mount either electrical, optical or combinations of electrical and optical components in accordance with the principles of the invention and may be interconnected with other circuit card assemblies via ones of connectors 123, 124 and plug-in circuit card assembly mounting apparatus.

Heat transferring structure 11, FIG. 2, is assembled to printed wiring circuit 12 and serves to transfer heat generated by components 13 to heat sink 102 for dissipation. Structure 11 supports printed wiring circuit 12 on an upper surface thereof and is formed with a plurality of heat absorption pedestals 111. Heat absorption pedestals 111 are constructed of a heat conducting material and each is formed to extend upward from a surface of structure 11 through a corresponding printed wiring circuit aperture 121 to engage a component 13 positioned over aperture 121.

Structure 11, FIG. 1, has a heat sink device 102 formed at one end for dissipating heat generated by components 13. Depending upon particular applications, heat sink 102 may be a single device or a plurality of devices as shown in FIG. 2. Heat sink device 102 is affixed to a pair of plates 100, 110 each extending outward from heat sink device 102. One plate 110 supports printed wiring circuit 12 and mounts heat absorption pedestals 111 to extend through apertures 121 in engagement with components 13. Plate 110 may either be a separate configuration having pedestals 111 formed thereon or may be a separate structure having pedestals 111 mounted thereon and affixed thereto to extend through apertures 121 to engage components 13.

Heat pipes, hereinafter vent robes 101, are positioned between the pair of plates 100, 110. Each vent tube 101 has one end engaging one of heat absorption pedestals 111 and the opposite end engaging heat sink device 102 and functions to conduct heat generated by pedestal engaged component 13 to heat sink device 102. Each vent tube 101 has a liquid sealed therein that is of a quantity less than 25 percent of the vent tube volume. The liquid is converted generated by a component 13 and absorbed by the corresponding pedestal 111 that enables the vent tube 101 engaged with pedestal 111 to conduct component generated heat to heat sink device 102.

We claim:

1. A circuit card assembly comprising
   a printed wiring circuit mounting a plurality of components and connectors and having conducting paths interconnecting ones of the components and ones of the components with the connectors,
   a heat transfer assembly including a heat sink and means, assembled to said printed wiring circuit and engaging ones of the components, for transferring heat generated by the engaged components to the heat sink for dissipation,
   said printed wiring circuit comprising a generally rectangular configured board having a plurality of apertures formed therein with each aperture having a plurality of contacts formed around a perimeter of the aperture with each contact engaging a corresponding terminal of a component positioned over the aperture and with at least some of the contacts coupled with an electrical conducting path formed on the printed wiring circuit board, said means for transferring heat comprising a plurality of pedestals each projecting through an aperture and having a first surface and second surface opposite said first surface, said first surface engaging one of said components and said second surface thermally coupled to said heat sink.

2. The circuit card assembly set forth in claim 1 wherein said printed wiring circuit board comprises
   an electrical connector affixed to one end of the printed wiring circuit board and having connector terminals terminating ones of electrical conducting paths for interconnecting the terminated electrical conducting paths with plug-in circuit card assembly mounting apparatus.

3. The circuit card assembly set forth in claim 1 wherein one of said connectors comprises
   an optical connector affixed to one end of the printed wiring circuit and terminating optical conductors of ones of the components for interconnecting the optical connector terminated optical conductors with the plug-in circuit card assembly mounting apparatus.

4. The circuit card assembly set forth in claim 1 wherein said heat sink further comprises
   a plurality of vent tubes positioned between a pair of plates with each vent tube having one end engaging one of the pedestals and an opposite end engaging said heat sink to conduct heat generated by the components to said heat sink.

5. The circuit card assembly set forth in claim 4 wherein said vent tubes comprises
   a liquid sealed within each vent tube of a quantity less than 25 percent of the vent tube volume and which liquid is converted into a vapor by heat generated by a component for conducting the component generated heat to a said heat sink.

6. A circuit card assembly comprising
   a printed wiring circuit mounting a plurality of components and connectors and having conducting paths interconnecting ones of the components and ones of the components with the connectors, and
   a structure assembled to said printed wiring circuit and having a heat sink with a pair of metal plates extending outward therefrom with one plate supporting said printed wiring circuit and mounting a plurality of heat absorption pedestals each engaging corresponding ones of the components and having a plurality of vent tubes positioned between the plates with each vent tube having one end engaging one of the pedestals and an opposite end engaging the heat sink to conduct heat from the components to the heat sink.

7. A circuit card assembly comprising in combination
   a generally rectangular configured printed wiring circuit board mounting a plurality of components and having a plurality of apertures formed therein with each aperture having a plurality of contacts formed around a perimeter of the aperture with each contact engaging a corresponding terminal of one of the components positioned over the aperture and with each contact coupled with one of a plurality of electrical conducting paths located on the printed wiring circuit board, a connector mounted on one end of the printed wiring circuit board and having connector terminals terminating ones of the electrical conducting paths for interconnecting the terminated electrical conducting paths with plug-in circuit card assembly mounting apparatus, a heat sink device mounted on an end of said printed wiring circuit board opposite said connector for dissipating heat generated by ones of the components and which heat sink device is affixed to a pair of metal plates extending outward from the heat sink device with one plate supporting the printed wiring circuit board and mounting heat absorption pedestals each extending upward from a surface of the one plate through a corresponding printed wiring circuit board aperture and engaging the component positioned over the aperture, and a plurality of vent tubes positioned between the pair of plates with each vent tube having one end engaging one of the pedestals and an opposite end engaging the heat sink device to conduct heat generated by a pedestal engaged component to the heat sink device.

8. A circuit card assembly comprising in combination a generally rectangular configured printed wiring circuit board mounting a plurality of components and having a plurality of apertures formed therein with each aperture having a plurality of contacts formed around a perimeter of the aperture with each contact engaging a corresponding terminal of one of the components positioned over the aperture and with each contact coupled with one of a plurality of electrical conducting paths located on the printed wiring circuit board, an optical connector mounted on one end of the printed wiring circuit board and terminating optical conductors of ones of the components for interconnecting the terminated component optical conductors with plug-in circuit card assembly mounting apparatus, a heat sink device mounted on an end of said printed wiring circuit board opposite said optical connector for dissipating heat generated by ones of the components and which heat sink device is affixed to a pair of metal plates extending outward from the heat sink device with one plate supporting the printed wiring circuit board and mounting heat absorption pedestals each extending upward from a surface of the one plate through a corresponding printed wiring circuit board aperture and engaging the component positioned over the aperture, and a plurality of vent tubes positioned between the pair of plates with each vent tube having one end engaging one of the pedestals and on opposite end engaging the heat sink device to conduct heat generated by a pedestal engaged component to the heat sink device.

9. A circuit card assembly comprising in combination a generally rectangular configured printed wiring circuit board mounting a plurality of components and having a plurality of apertures formed therein with each aperture having a plurality of contacts formed around a perimeter of the aperture with each contact engaging a corresponding terminal of one of the components positioned over the aperture and with each contact coupled with one of a plurality of electrical conducting paths located on the printed wiring circuit board, a pair of connectors each mounted on one end of the printed wiring circuit board with one connector having connector terminals terminating ones of the electrical conducting paths for interconnecting the terminated electrical conducting paths with plug-in circuit card assembly mounting apparatus and with the other connector mounted at the one end adjacent the one connector and terminating optical conductors of ones of the components for interconnecting the terminated optical conductors with the plug-in circuit card assembly mounting apparatus, a structure supporting the printed wiring circuit board and formed with a plurality of heat absorption pedestals each extending upward from a surface of the structure through a corresponding printed wiring circuit board aperture and engaging the component positioned over the aperture wherein said structure comprises, a heat sink device for dissipating heat generated by the components and which heat sink device is affixed to a pair of metal plates extending outward from the heat sink device with one plate supporting the printed wiring circuit board and mounting said heat absorption pedestals, and a plurality of vent tubes positioned between the pair of plates with each vent tube having one end engaging one of the pedestals and an opposite end engaging the heat sink device to conduct heat generated by a pedestal engaged component to the heat sink for dissipation.

* * * * *